(12) United States Patent
Overweg

(10) Patent No.: US 6,429,655 B1
(45) Date of Patent: Aug. 6, 2002

(54) MR APPARATUS PROVIDED WITH A GRADIENT COIL SYSTEM

(75) Inventor: Johannes Adrianus Overweg, Uelzen (DE)

(73) Assignee: Koninklijke Philips Electronics N.V., Eindenhoven (NL)

(*) Notice: Subject to any disclaimer, the term of this patent is extended or adjusted under 35 U.S.C. 154(b) by 0 days.

(21) Appl. No.: 09/773,420

(22) Filed: Feb. 1, 2001

(30) Foreign Application Priority Data

Feb. 3, 2000 (DE) .......................................... 100 04 765

(51) Int. Cl.$^7$ ................................................. G01V 3/00
(52) U.S. Cl. ........................................ 324/318; 324/319
(58) Field of Search ................................. 324/318, 319, 324/320, 321, 322, 306, 307, 309

(56) References Cited

U.S. PATENT DOCUMENTS

| | | | | | |
|---|---|---|---|---|---|
| 4,486,711 A | * | 12/1984 | Frese et al. | .................. | 324/319 |
| 5,012,192 A | * | 4/1991 | Siebold | ....................... | 324/318 |
| 5,666,054 A | * | 9/1997 | Westphal | ..................... | 324/318 |

* cited by examiner

*Primary Examiner*—Louis Arana
(74) *Attorney, Agent, or Firm*—John Vodopia

(57) ABSTRACT

The invention relates to an MR apparatus with three gradient coils, the differences between said gradient coils are reduced in that the gradient directions extend obliquely to the direction of the main magnetic field.

11 Claims, 3 Drawing Sheets

MR APPARATUS PROVIDED WITH A GRADIENT COIL SYSTEM

Figure 1:
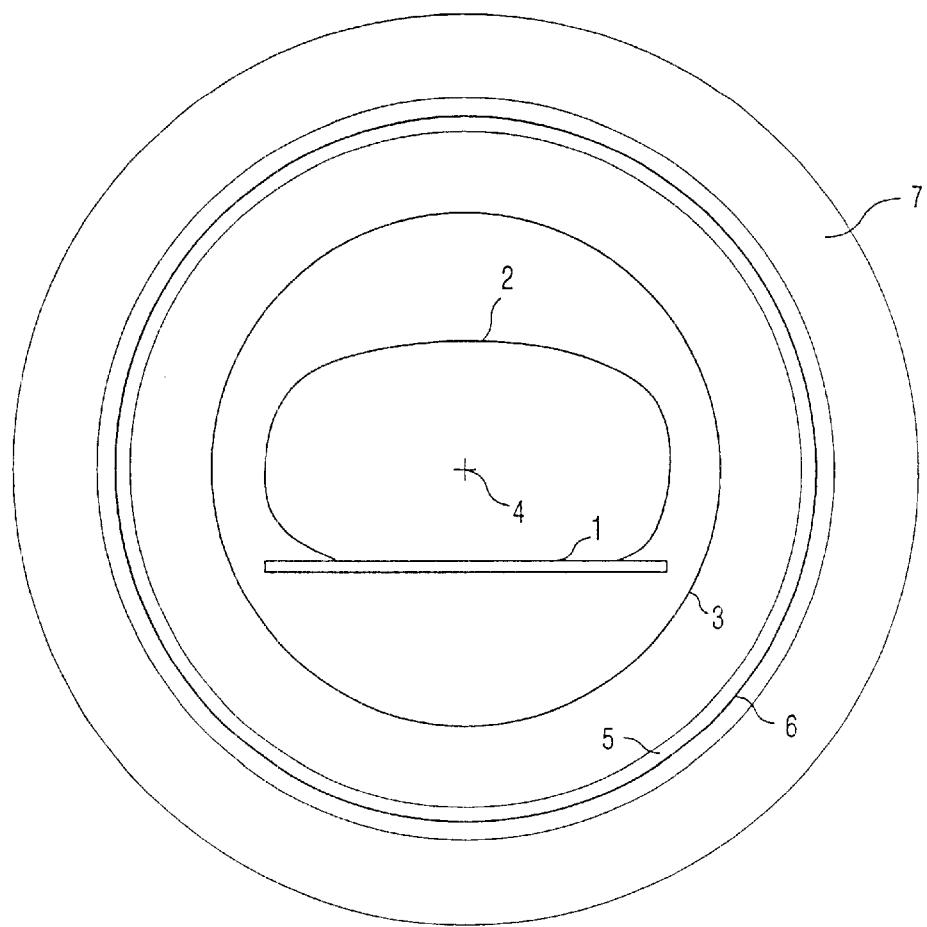

The invention relates to an MR apparatus which includes
- a main field magnet for generating a uniform, steady magnetic main magnetic field in an examination zone,
- a gradient coil system which includes three gradient coils for generating magnetic fields which extend parallel to the main magnetic field and have gradients extending in different directions.

The invention also relates to a gradient coil or a gradient coil system for an MR apparatus.

Such MR apparatus with a gradient coil system with three gradient coils have been known since long. The magnetic fields that can be generated by the individual gradient coils have a gradient which extends either perpendicularly or parallel to the main magnetic field. In order to generate a gradient extending in the direction of the main magnetic field use is made of gradient coils of the Helmholtz type which have two spatially separated groups of conductors which circularly enclose the examination zone (in the case of a closed magnet with a cylindrical patient opening. The gradient coils for generating gradients extending perpendicularly to the main magnetic field, however, are coils of the saddle type. In MR apparatus with closed magnets the conductors of such a gradient coil may also be present on the surface of a cylinder, but the conductors of the individual segments of this coil do not completely enclose the examination zone but cover each time only a part of the circumference of the cylindrical surface.

Because of the different construction of the gradient coils they also have different properties. For example, such differences cause a different eddy current behavior, which itself gives rise to different pulse responses. Consequently, artifacts occur in the MR image when gradients are generated which extend obliquely relative to the main magnetic field while different gradient coils are simultaneously active.

Furthermore, the energy required to generate a gradient of the same magnitude by means of the various gradient coils also differs; the gradient coils of the Helmholtz type require less energy for this purpose than gradient coils of the saddle type. As a result, the electric power required to generate a defined gradient within a given period of time is also dependent on the relevant type of coil. Therefore, the gradient amplifiers for delivering these currents for the gradient coils are also loaded to a different extent.

This fact can be taken into account by utilizing gradient amplifiers having a different maximum power, be it that the differences in the gradient channels become even larger and the described artifacts may even be intensified. Instead, however, use can also be made of identically constructed gradient amplifiers. The power reserves of the amplifier for the gradient direction coincident with the direction of the main magnetic field will not be fully utilized in that case (if the same maximum value of the gradient is to be reached in all three gradient directions and also the same slope of the gradient pulses). However, there is the advantage of a simpler configuration and there are also logistic advantages.

It is an object of the present invention to improve an MR apparatus of the kind set forth such that the differences between the various gradient coils are at least reduced. On the basis of an NMR apparatus of the kind set forth this object is achieved according to the invention in that the gradient coils are configured in such a manner that the gradients enclose angles other than 0° and 90° relative to the direction of the main magnetic field.

The invention is based on the recognition of the fact that the gradient coils required for generating gradients extending obliquely relative to the main magnetic field are neither pure Helmholtz coils nor pure saddle coils (that is, when they have the same, for example, cylindrical, geometrical shape). The gradient coils according to the invention instead constitute a mixture of the two types of coil. For example, in the case of a cylindrical coil shape this means that there is a conductor segment which extends (like in a Helmholtz coil) across the entire circumference (360°) of the cylinder whereas another conductor segment of the gradient coil extends over only a part of the circumference. Therefore, the properties and construction of the gradient coils for the various gradient directions do not deviate as much from one another as in an MR apparatus in which the gradients extend either in the direction of the main magnetic field or perpendicularly thereto.

The invention is used for cylindrical gradient coils as used for closed main field magnets which completely enclose the examination zone while leaving a cylindrical patient opening only at the center.

In a further feasible application which is suitable for so-called open main field magnets (or open MRI), the main field magnet has a respective magnet pole above and below the examination zone and each gradient coil consists of a pair of coils (in this context the term gradient coil is to be broadly interpreted) above and below the examination zone, the gradient coils being simultaneously traversed by a current in opposite directions. In the case of such differences the difference between the coils for generating a gradient extending in the direction of the main magnetic field and the coils for generating a gradient extending perpendicularly thereto is even much larger than in an MR apparatus with a closed magnet system.

In a preferred embodiment, three gradient coils may have the same construction and merely are rotated 12020 about the symmetry axis relative to one another. When the three coils enclose an angle of approximately 55° relative to the direction of the main magnetic field, the directions of the three gradients extend perpendicularly to one another. However, inductive couplings may then arise between the three coils, such couplings can be avoided in the case of a smaller or a larger angle between the gradients on the one side and the direction of the main magnetic field on the other side.

Figure 2:
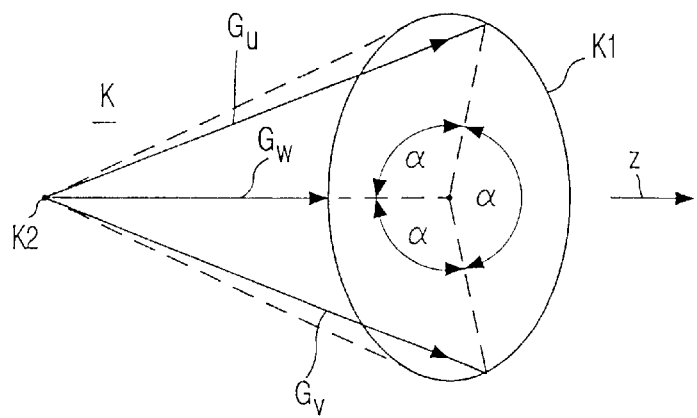
Figure 3:
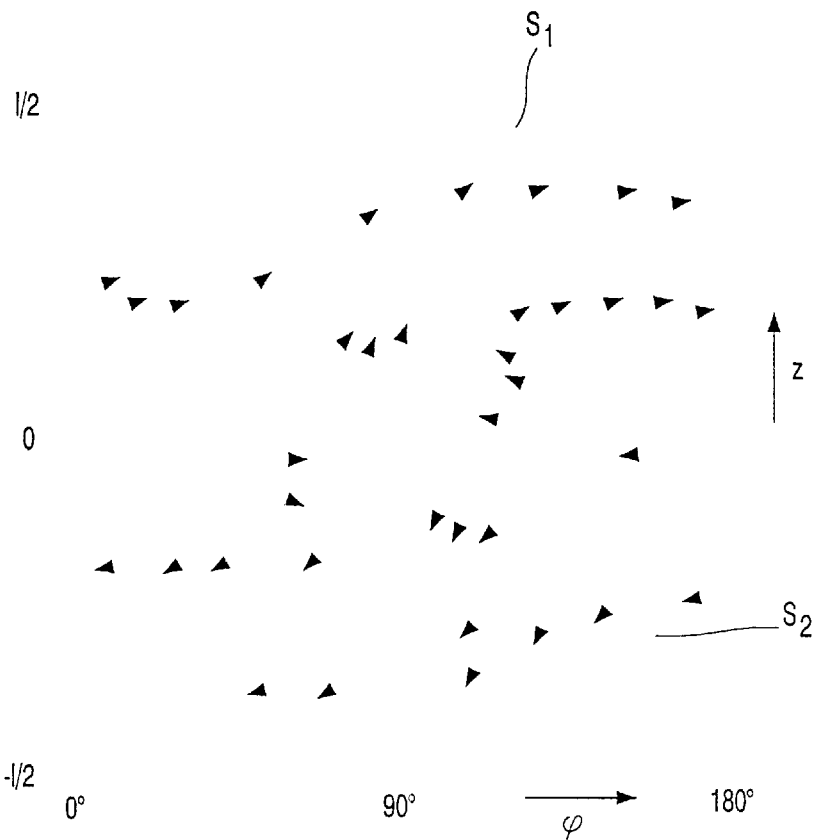
Figure 4:
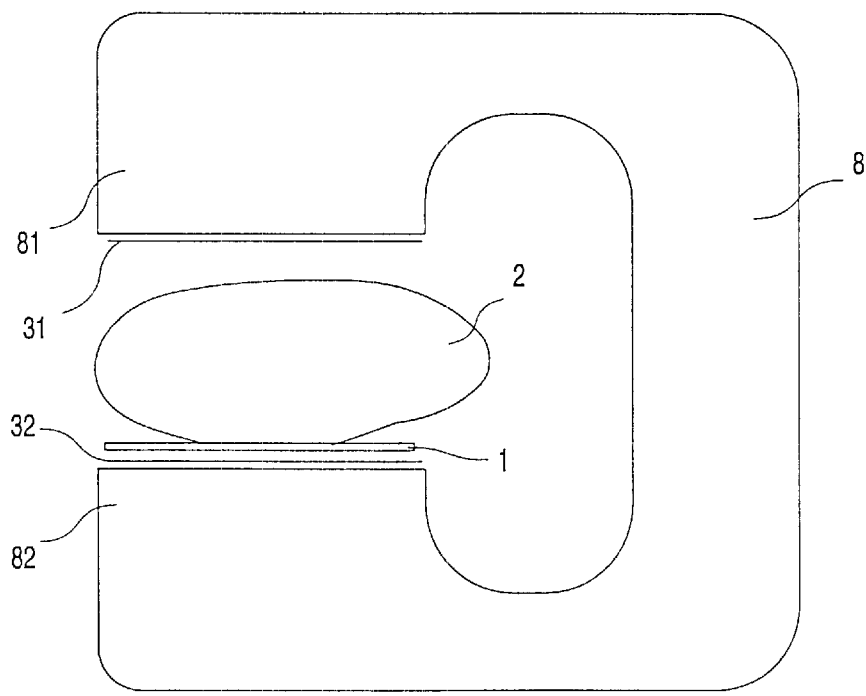
Figure 5:
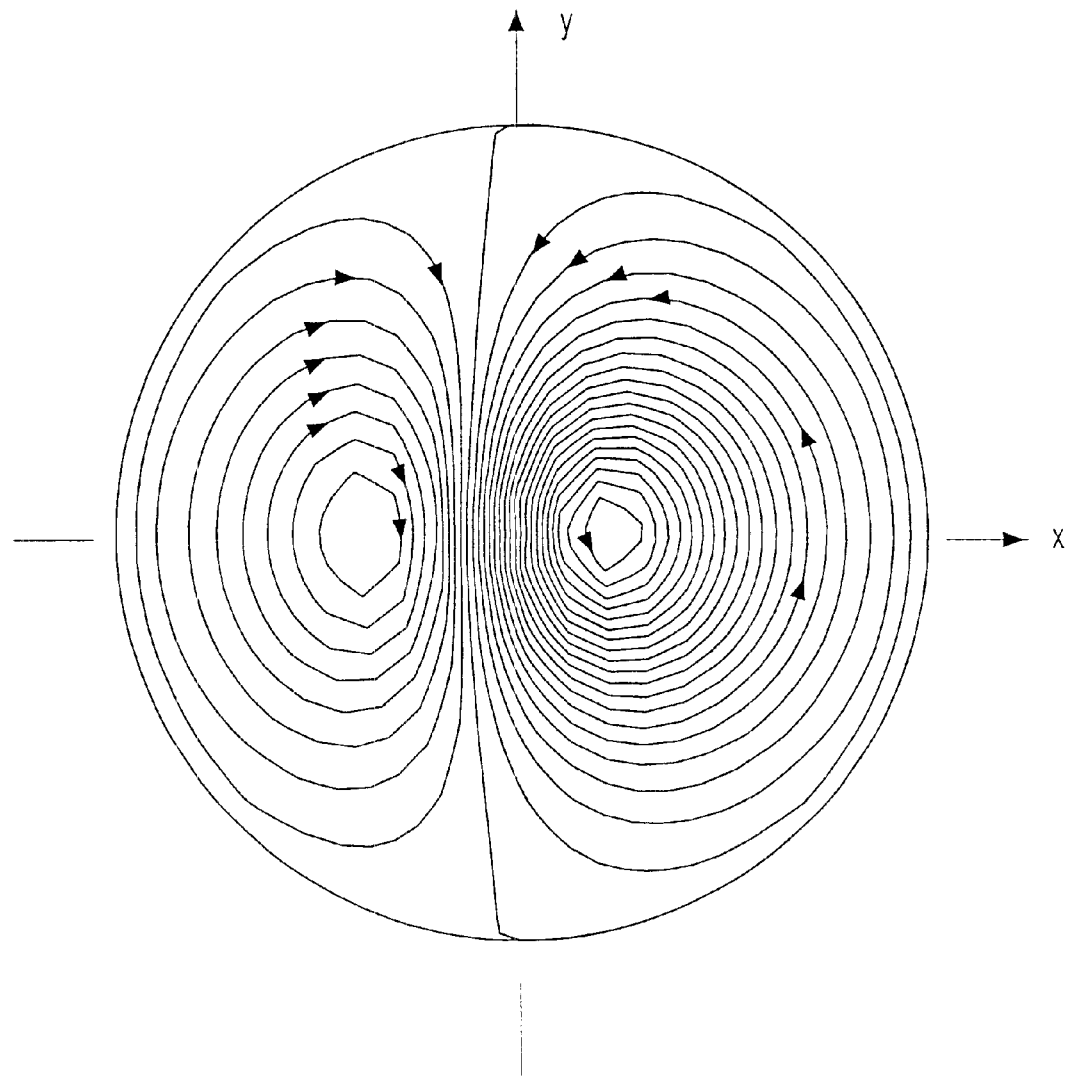

The invention will be described in detail hereinafter with reference to the drawings. Therein:

FIG. 1 shows an MR apparatus with a closed main field magnet in which the invention can be used, FIG. 2 shows the position of the gradients in relation to the direction of the main magnetic field, FIG. 3 shows a part of a development of a gradient coil according to the invention, FIG. 4 is a diagrammatic representation of an MR apparatus with an open magnet, and FIG. 5 shows the current variation in a gradient coil suitable for the MR apparatus shown in FIG. 4.

The reference numeral 1 in FIG. 1 denotes a table for accommodating an object 2 to be examined, for example a patient. The space available for the examination, that is, the examination space, and the table are enclosed by an RFcoil (not shown) which itself is enclosed by a gradient coil system 3. Even though the cross-section of the gradient coil 3 is represented by a single line only, it consists of three gradient coils which enclose one another. Each gradient coil includes, for example, a layer of conductors having a thickness of 2.5 mm, said layers being isolated from one another by intermediate layers having a thickness of 0.5 mm.

The gradient coil system 3 is enclosed by a concentric tube 5 of a synthetic material, the outer side of which is provided with a so-called active shield 6 for the gradient coil system 3. The active shield 6 itself consists of three coils having a circular cross-section, each of which is traversed by each time the same current as one of the gradient coils. Therefore, the magnetic fields of these coils compensate one another in the external zone, that is, in the metal housing of a cryostat 9, so that practically no eddy currents are generated therein.

The cryostat 9 accommodates a cylindrical (closed) magnet (not shown) which generates a steady magnetic field 10 which extends perpendicularly to the plane of drawing of FIG. 1 and is uniform at least in the examination zone. The symmetry axis 4 of the components 3, 5, 6 and 7 is formed by the central axis of these components which extends perpendicularly to the plane of drawing. The symmetry axis thus extends in the direction of the main magnetic field.

Each of the three gradient coils of the gradient coil system 3 is capable of generating a respective magnetic field whose component extending in the direction of the main magnetic field has a location-dependent field strength which disappears in the isocenter, being a point situated on the symmetry axis 4 at the center of the examination zone. The magnetic fields generated by the three gradient coils have a gradient which is essentially constant in the examination zone and has a direction which deviates from the other gradient directions.

This is indicated in FIG. 2 which shows a straight circular cone, that is, a cone having a circle $K_1$ as its base and an apex $K_2$, the perpendicular from the apex $K_2$ to the circle $K_1$ being incident at the center thereof. The direction of the perpendicular is denoted by the arrow z which extends in the direction of the main magnetic field. The gradients $G_u$, $G_v$ and $G_w$ that can be generated by means of the three gradient coils are surface lines of the cone K, that is, they connect the apex to the edge of the circle $K_1$, that is, in such a manner that the lines terminate at points regularly distributed across the circle (the projections of the gradients on the circular surface thus form an angle $\alpha=120°$ relative to one another). When the angle between the gradients $G_u$, $G_v$, $G_w$ and the perpendicular amounts to 55° (or more exactly speaking, 54.74°), the three gradients enclose an angle of 90° relative to one another as is customary in conventional coil systems in which the gradients, however, extend parallel or perpendicular to the main magnetic field.

However, the angle between the perpendicular and the gradient directions may also be larger or smaller while maintaining the rotational symmetry so that the arrangement can be optimized in a different manner. For example, the angle may be chosen to be so large that the inductive coupling between the coils is zero. In such cases the gradients that can be generated by the three gradient coils would enclose an angle other than 90° relative to one another, but in one such case any arbitrary gradient direction could also be generated by simultaneous activation of one or more gradient coils, the gradients of the activated gradient coils then being added vectorially at the ratio of the currents in these coils.

A gradient coil that has the cylindrical shape shown in FIG. 1 and is capable of generating a magnetic field which extends in the direction of the symmetry axis 4 and has a gradient extending obliquely to the symmetry axis (for example, $G_u$), is also suitable for generating the other two gradients ($G_v$, $G_w$) merely by rotating the gradient coil 120° about the symmetry axis 4. The three gradient coils can thus have the same construction (and hence also the same properties) and the gradient amplifiers feeding these coils may also have an identical construction, so that identical pulse responses are obtained for all three gradient channels. Consequently, the described image artifacts cannot occur.

The construction of one of these gradient coils is presented in FIG. 3 which shows the necessary current density variation, that is, for half a development of the gradient coil of the length 1. The current density is symbolized by flow lines whose density represents the magnitude of the current density and whose direction corresponds to the direction of the current density. The circumferential direction $\phi$ is indicated in the horizontal direction and the direction z of the main magnetic field is plotted vertically. The complete current density variation of the development is obtained when the diagram is mirrored about the line $\phi=0$ or $\phi=180°$ (be it that the arrows of the flow lines are not to be mirrored). It appears that there are some flow lines, for example the flow line SI, which extend across the entire circumference (from $\phi=0$ to $\phi=360°$), but do not extend as a straight line in the circumferential direction. However, there are also flow lines (for example, $S_2$) that are also closed in themselves but do not extend across the entire circumference.

The course of the conductor tracks in such a gradient coil is essentially the same as that of the flow lines. Using suitable interruptions and connections to neighboring conductor tracks it must merely be ensured that the current can flow from one conductor track to another, so that all conductor tracks are successively traversed by the same current.

The current density variation shown in FIG. 3 can be simply determined by weighted summing of the current density variations of a gradient coil with a gradient extending in the direction of the main magnetic field (the flow lines then extend horizontally and symmetrically relative to the axis z =0) and a saddle coil for generating a gradient extending perpendicularly thereto. Summing the current density vectors in corresponding points of these known current density variations for these points yields a current density vector which is dependent on the weighting factor used to weight the two components. When the two said components are weighted at the ratio 1:√2, the addition will yield the current density for a gradient coil having a gradient extending at an angle of 54.74° relative to the z direction.

The invention, however, can be used not only for the MR apparatus with a closed magnet system as shown in FIG. 1, but also for an MR apparatus with an open magnet system (so-called open MRI). An MR apparatus of this type is shown in FIG. 4. The main field magnet therein is denoted by the reference numeral 8. Between the facing poles 81 and 82 of the main magnet 8 there is generated a vertically extending main magnetic field. The gradient coil system consists of two sections 31 and 32, each of which comprises three essentially flat coils. Each time one coil of the upper section and one coil of the lower section, being simultaneously traversed by a current, together constitute a respective gradient coil. This coil generates a vertically extending magnetic field with a gradient whose direction encloses an angle of, for example 55° relative to the perpendicular (see FIG. 2).

FIG. 5 shows the current density variation for one of these coils. Two groups of flow lines that are closed in themselves and are offset in the horizontal direction can be distinguished, the right-hand group enclosing a region which is larger than that enclosed by the left-hand group and also has a higher flow line density. Consequently, there is obtained inter alia a gradient of the magnetic field which extends from right to left. As has already been stated, this coil constitutes a gradient coil in conjunction with a further coil on the other side of the examination zone. Said other coil is identical to the coil shown in FIG. 5, but has been rotated through 180° with respect thereto (about an axis which extends perpendicularly to the plane of drawing and through the center of the circular outer contour of the coil. Moreover, the flow line patterns in said other coil have an opposed direction. Consequently, such a coil pair generates in the examination zone a magnetic field whose z component (extending perpendicularly to the plane of drawing of FIG. 5 and in the direction of the main magnetic field) has a gradient which encloses an angle of 55° relative to the z axis and a component extending in the x direction.

In this case the current density variation can again be obtained by weighted summing of the current density variations of a $G_z$ coil (being a coil for generating a gradient extending perpendicularly to its surface with circular, concentric flow lines) and a $G_x$ or $G_y$ coil (being a coil with two semi-circular patterns of flow lines mirrored relative to the x axis and the y axis, respectively, in FIG. 5). The coil shown in FIG. 5, resulting from such weighted summing, requires more energy for generating a defined gradient in comparison with said $G_z$ coil, but only 80% of the energy required by said $G_x$ and $G_y$ coils for generating such a gradient. Using the same gradient amplifiers, therefore, a 10% stronger gradient or a rise time that has been reduced by 20% can be achieved.

For both other coil pairs the foregoing holds analogously. The only difference consists in that these coil pairs must be rotated 120° (relative to the center of the coil) in comparison with the rendition of FIG. 5.

The invention has been described on the basis of embodiments in which the gradient coils are shaped as circles or cylinders. The invention, however, can also be used in MR apparatus having a shape (as described in German patent application P . . . (PHD 99-157) other than rotational symmetry. The gradients generated by such gradient coils need not extend rotationally symmetrically relative to the direction of the magnetic field. Such gradient coils may still offer advantages in comparison with gradient coils having gradients extending parallel or perpendicularly to the magnetic field.

The current density variation for the three coils of an active shield (8 in FIG. 2) can be determined analogously by weighted summing of the current density variations of the basic coil types in the same way as described above for the gradient coils. Therefore, they generate correspondingly oriented gradients. All coils can be supported by a non-conductive structure (5 in FIG. 1) in the same way as conventional coils.

What is claimed is:

1. An MR apparatus which comprises:
    a main field magnet which generates a uniform, steady main magnetic field in an examination zone, and
    a gradient coil system which includes three gradient coils which generate magnetic fields which extend parallel to the main magnetic field and have gradients which extend in different directions, wherein the gradient coils are configured in such a manner that the gradients enclose angles other than 0° and 90° relative to the direction of the main magnetic field.

2. An MR apparatus as claimed in claim 1, wherein the gradient coils have a cylindrical shape which encloses the examination zone, the cylinder axis extending in the direction of the main magnetic field.

3. An MR apparatus as claimed in claim 1, wherein each gradient coil is formed by a pair of coils which are situated at opposite sides of the examination zone and are traversed by the current in opposite directions in the operating condition, said coils generating a magnetic field extending in the direction of the main magnetic field.

4. An MR apparatus as claimed in claim 1, wherein the gradient coils are rotationally symmetrically oriented relative to the direction of the main magnetic field.

5. An MR apparatus as claimed in claim 4, wherein the gradients enclose an angle of between 45° and 65° relative to the direction of the main magnetic field.

6. A gradient coil system which includes three gradient coils as claimed in claim 5, wherein the gradient coils have the same construction and the gradients that are generated are oriented rotationally symmetrically relative to an axis extending parallel to the direction of the magnetic field that can be generated by the gradient coil system.

7. An MR apparatus according to claim 5, wherein the enclosed gradient angle is approximately 55° relative to the direction of the main magnetic field.

8. An MR apparatus as claimed in claim 1, wherein at a side of the coils of the gradient coil system which is remote from the examination zone, an active shield with three coils is provided which generate gradients which are oriented in the same way as the coils of the gradient coil system and compensate the magnetic field in the external region.

9. An MR apparatus according to claim 1, wherein the gradient coils each comprise a hybrid construction of two different coil types.

10. An MR apparatus according to claim 9, wherein the two different coil types are a Helmholtz coil and a saddle coil.

11. A gradient coil for an MR apparatus, constructed such that in an operating condition a magnetic field having a gradient whose direction encloses an angle other than 0° and 90° relative to the direction of the magnetic field is generated.

* * * * *